United States Patent [19]

Matsuda et al.

[11] Patent Number: 4,900,526

[45] Date of Patent: Feb. 13, 1990

[54] POLYCRYSTALLINE RHOMBOHEDRAL BORON NITRIDE AND METHOD OF PRODUCING THE SAME

[75] Inventors: Toshitsugu Matsuda, Yokohama; Hiroyuki Nakae, Kawasaki; Toshio Hirai, 4-91, Takamori 3-chome, Izumi-shi, Miyagi 981-31, all of Japan

[73] Assignees: Research Development Corporation of Japan; Japan Metals & Chemicals Co., Ltd.; The Furukawa Electric Company, Ltd., all of Tokyo; Toshio Hirai, Yokohama, all of Japan; a part interest

[21] Appl. No.: 887,096

[22] PCT Filed: Feb. 27, 1986

[86] PCT No.: PCT/JP86/00095

§ 371 Date: Jul. 3, 1986

§ 102(e) Date: Jul. 3, 1986

[87] PCT Pub. No.: WO86/05169

PCT Pub. Date: Sep. 12, 1986

[30] Foreign Application Priority Data

Mar. 4, 1985 [JP] Japan .................................. 60-41019

[51] Int. Cl.$^4$ ........................................... C01B 21/064
[52] U.S. Cl. ........................ 423/290; 148/DIG. 113; 156/DIG. 86; 204/157.41; 204/157.43; 204/157.45; 427/255.2; 501/96
[58] Field of Search ......................... 423/290; 501/96; 427/255.2; 156/DIG. 86; 148/DIG. 113; 204/157.41, 157.43, 157.45

[56] References Cited

U.S. PATENT DOCUMENTS 3,152,006 10/1964 Basche ................................ 423/290
4,419,335 12/1983 Ishii et al. ............................ 423/290
4,565,747 1/1986 Nakae et al. ........................ 428/698

FOREIGN PATENT DOCUMENTS 155508 8/1985 Japan .................................... 423/290
1203078 8/1970 United Kingdom ............. 427/255.2

OTHER PUBLICATIONS

Toshitsugu Matsuda et al., "Synthesis and Structure of Chemically Deposited Boron Nitride" *J. Mater. Sci.* 21(2) 649–658 (1986).
Y. Matsui et al., "Formations of Rhombohedral Boron Nitride, as Revealed by TEM-electron Energy Loss Spectroscopy" *J. Mater. Sci.* 16(4), 1114–1116 (1981).
*Hack's Chemical Dictionary,* McGraw-Hill Book Company, New York, 1969, p. 464.

(List continued on next page.)

*Primary Examiner*—Robert L. Stoll
*Assistant Examiner*—Jeffrey Edwin Russel
*Attorney, Agent, or Firm*—Oblon, Spivak, McClelland, Maier & Neustadt

[57] ABSTRACT

The specification discloses a polycrystalline boron nitride of high purity and high density consisting essentially of rhombohedral crystals in which the three-fold rotation axes, parallel to the c-axis in the notation of hexagonal crystal system, of the crystals have a preferred orientation. The polycrystalline rhombohedral boron nitride can be obtained as bulk or thin film articles with desired shapes by chemical vapor deposition including the steps of introducing a source gas of boron and a source gas into a reactor containing a heated substrate and depositing boron nitride onto the heated substrate, wherein a diffusion layer of the source gas of nitrogen and/or the carrier gas is formed around the substrate. The polycrystalline rhombohedral boron nitride such obtained is very useful in applications such as crucibles for melting semiconductors, various jigs for high temperature services, high-frequency insulator, microwave transmission window and source material of boron for semiconductor. Further, the boron nitride is also ideal as a starting material for high pressure phase cubic boron nitride.

10 Claims, 3 Drawing Sheets

OTHER PUBLICATIONS

Tadao Sato, "Influence of Monovalent Anions for the Formation of Rhombohedral Boron Nitride, r–Bn" *Proc. Jpn. Acad. Ser. B.*, 61(10), 450–463, 1985.

Basche et al., "New Pyrolitic Boron Nitride," Materials In Design Engineering, Feb. 1964, pp. 78"81.

Malé et al., "Preparation of Pyrolitic Boron Nitride By CVD At Reduced Pressure," 1979, CVD Conference, pp. 391–397.

Belforti et al., "Highly Oriented Boron Nitride," Nature, 6-3-1961, p. 901.

Archer, "The Preparation and Properties of Pyrolytic Boron Nitride," pp. 167-180.

Ishii et al., "Growth of Whiskers of Hexagonal Boron Nitride," Journal of Crystal Growth 52(1981), 285-289.

Journal of Crystal Growth, vol. 52 (1981) (Amsterdam) T. Ishii, et al., "Growth of Whiskers of Hexagonal Boron Nitride" pp. 285-289.

Yogyo Kyokai-shi, vol. 89, No. 2, Feb. 1981, Tokyo, Takahashi Takehiko, and two others, "Nickel Kibanjyo eno Chikka Housomaku no CVD."

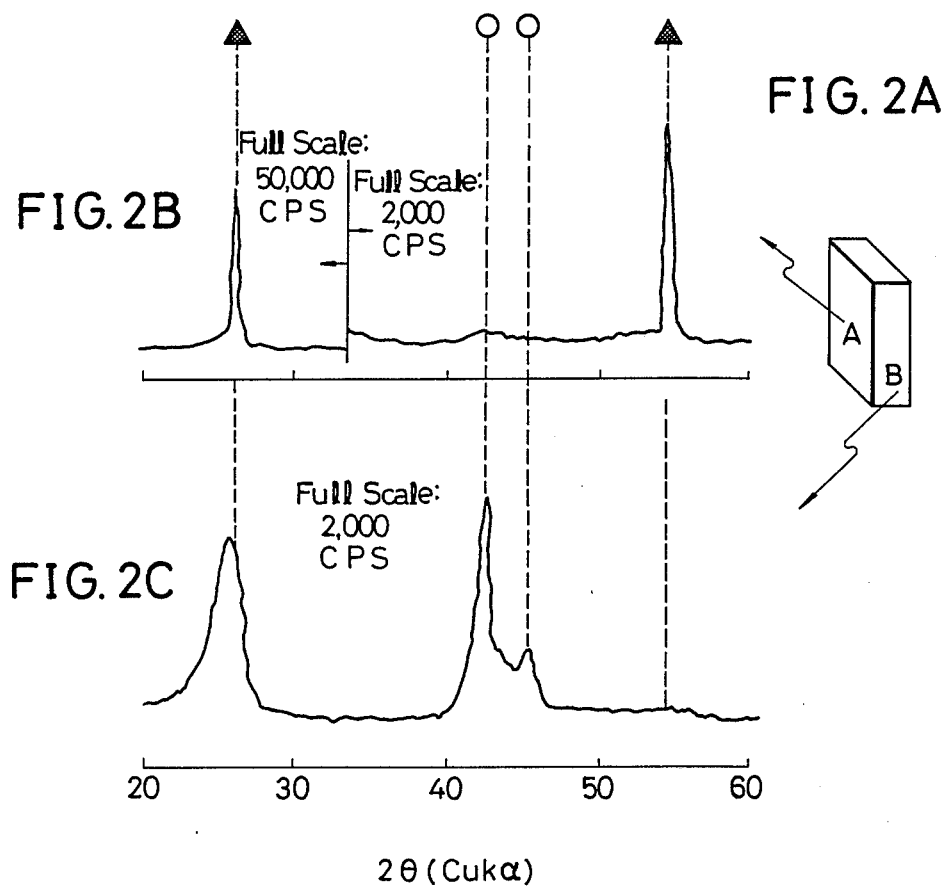

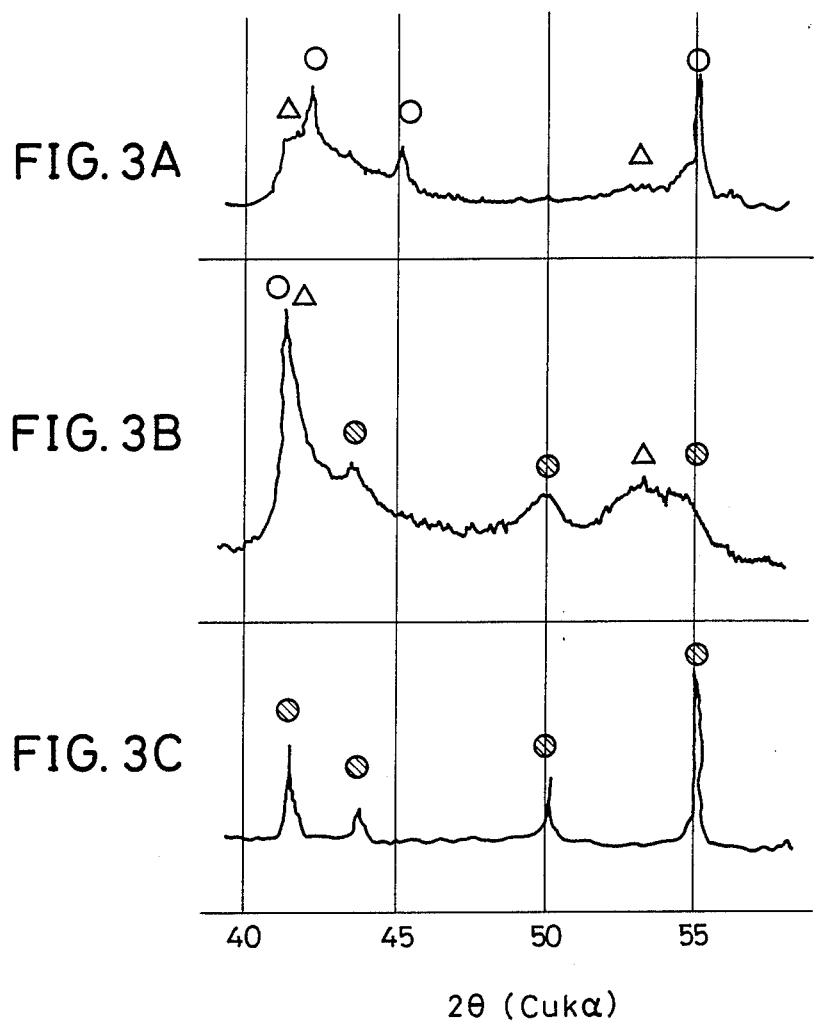

POLYCRYSTALLINE RHOMBOHEDRAL BORON NITRIDE AND METHOD OF PRODUCING THE SAME

TECHNICAL FIELD

The present invention relates to polycrystalline boron nitride of high purity and high density comprising rhombohedral crystals and a method of producing the same. The present invention is to provide materials suitable not only as a starting material of high pressure phase cubic boron nitride but also as materials for crucibles used in melting semiconductive compounds, various jigs for high temperature service, high frequency insulators and microwave transmission windows and as a diffusion source of boron in various semiconductors.

BACKGROUND ART

Boron nitride is a compound consisting of boron and nitrogen in an atomic ratio of 1:1. Boron nitride is known to exist in several crystal structures when formed at atmospheric pressure. The structures are an amorphous structure (including a turbostratic structure), a hexagonal crystal and a rhombohedral (or trigonal) crystal.

Among these structures, rhombohedral boron nitride is different from hexagonal boron nitride and amorphous boron nitride in the stacking mode of layers of hexagonal network formed by alternatively linked boron and nitrogen. More specifically, the hexagonal crystal structure is built up by a two-layered stacking sequence, such as ABABAB ...; rhombohedral crystal structure is composed of a stack of the period of three layers, such as ABCABCABC ...; and amorphous boron nitride does not have such regularity or periodicity in its stacked structure.

On the other hand, there have been known, as high pressure phase boron nitride, wurtzite type boron nitride and cubic boron nitride (or also referred to as zinc blend type boron nitride) and, of these two, particularly cubic boron nitride is highly valuable as an industrial material because of its super-high hardness and high thermal conductivity. It can be explained that the structures of wurtzite type boron nitride and cubic boron nitride are formed when the atoms constituting the hexagonal network structure of atmospheric pressure phase boron nitride alternatively deviate from the plane of the hexagonal network to form a zig-zag network in which wurtzite type boron nitride has a two-layered stacking sequence (ABABAB ....) and cubic boron nitride has a three-layered stacking repetition (ABCAB-CABC ...). Therefore, it can be assumed from the comparison between the stacking sequences of the atmospheric phase boron nitride and the high pressure phase boron nitride that atmospheric phase rhombohedral boron nitride is liable to transform into cubic boron nitride. Factually, the validity of this assumption was experimentally justified by explosive shock compression described in Journal of American Ceramic Society, Vol. 65, No. 10, page c-162 (1982). As set forth above, rhombohedral boron nitride is very suitable as a starting material for the preparation of cubic boron nitride and thus has become increasingly important in industrial applications.

In Compt. Rend., Vol. 246, page 1866 (1958), it has been reported that the rhombohedral boron nitride set forth above can be prepared in powder form from the reaction of borax or boron oxide with potassium cyanide, together with hexagonal boron nitride powder.

Also, in Japanese Patent Application Laid-open No. 58-74 511 and J. Crystal Growth, Vol. 52, page 285 (1981), rhombohedral boron nitride is prepared as a white wool-like material by the reaction between an oxygen-containing boron compound and cyanide gas. However, J. Crystal Growth. Vol. 52, page 285 (1981) states that the wool-like boron nitride such prepared is an agglomerate composed of whiskers (i.e., single crystal) of rhombohedral boron nitride, whiskers of hexagonal boron nitride and filaments of boron nitride of poor crystallinity.

As described above, rhombohedral boron nitride obtained by any production method heretofore known is a mixture in a powder or wool-like form containing boron nitride having crystal structure different from rhombohedral structure and is entirely different from the bulk or thin film products of pure and high density polycrystalline boron nitride of the present invention which consists essentially of rhombohedral crystals with a preferred orientation. Further, any of the known methods of producing rhombohedral boron nitride set forth above is characterized in that an oxygen-containing boron compound is used as a boron source material and is reacted with a cyanide compound. Such known methods have the following problems. First, the methods use an extremely toxic cyanide compound and thus great care should be taken in handling it. A second problem is that rhombohedral boron nitride can be obtained only in a powder form or a wool-like form. The fact that rhombohedral boron nitride can be obtained only in a powder form or a wool-like form is extremely disadvantageous for industrial application because such boron nitride can not be easily sintered and thus a sintering acceleration agent is indispensably needed to convert the material to a bulk form. The use of the sintering acceleration agent will degrade the purity of the resulting products.

As pure and high density boron nitride with a preferred crystallite orientation, there have been known boron nitride referred to as vapor-deposited boron nitride or as pyrolytic boron nitride and many studies on those have been reported. Also, these boron nitrides have been produced on an industrial scale. For example, U.S. Pat. No. 3,152,006 describes a method for depositing turbostratic and/or hexagonal boron nitride in which reactant gases of boron halide and ammonia are mixed and reacted at a temperature of 150° to 200 °C. and the gaseous products formed by the reaction are then introduced into a reaction chamber to deposit boron nitride onto the surface of a substrate being maintained at a high temperature in the reaction chamber. Further, Japanese Patent Application which has been laid open to public inspection under 55-47 379 discloses that hexagonal boron nitride of high crystallinity can be formed at low temperatures by using iron as a substrate. Further studies on the production of boron nitride by vapor deposition have been also reported by Basch and Shiff in Material Design Engineering, February(1964), page 78; by Male and Salanoubat in Proceedings of the Seventh International Conference on Chemical Vapor Deposition, page 391 (1979); by Takahashi et al. in Journal of the Ceramic Society of Japan, Vol. 89, page 63 (1981); and by Hirayama and Shono in Journal of Electrochemical Society, Vol. 122, page 1671 (1975). However, these references all state that the boron nitrides produced by these known vapor deposition methods are amorphous boron nitride (including boron nitride with turbostratic structure) and/or hexagonal boron nitride, but not polycrystalline boron nitride comprising rhombohedral crystals referred to in the present invention.

Under such circumstances of the foregoing prior art, the object of the present invention is to provide highly pure polycrystalline boron nitride comprising rhombohedral crystals in a massive form or in a thin film form by vapor deposition. More specifically, an object of the present invention is to provide polycrystalline rhombohedral boron nitride of high purity and of high density which is industrially very useful as a starting material for cubic boron nitride and further the present invention is also directed to a method of producing such boron nitride.

DISCLOSURE OF THE INVENTION

The present invention is to provide a polycrystalline boron nitride of high purity and high density consisting essentially of rhombohedral crystals in which the three-fold rotation axes (parallel to the c-axis in the notation of hexagonal crystal system) of the crystals have a preferred orientation.

A further feature of this invention is directed to a method of producing the polycrystalline rhombohedral boron nitride set forth above by chemical vapor deposition method including the steps of introducing a source gas of boron and a source gas of nitrogen, with or without a diluting carrier gas, into a reactor containing a heated substrate and depositing boron nitride onto the substrate, wherein a diffusion layer of the source gas of nitrogen and/or the carrier gas is formed around the substrate, thereby producing the foregoing polycrystalline rhombohedral boron nitride.

BRIEF DESCRIPTION OF DRAWINGS

FIG. 2A is a schematic view showing a rectangular bulk boron nitride according to one embodiment of the present invention. FIGS. 2B and 2C are X-ray diffraction patterns of face A and face B of the rectangular bulk boron nitride, respectively, in which symbol "▲" is a diffraction line of the plane perpendicular to the three-fold rotation axis of rhombohedral crystal and symbol "o" is a diffraction line nearly parallel to the three-fold rotation axis.

FIG. 3A shows, in part, a powder X-ray diffraction pattern of polycrystalline rhombohedral boron nitride of including in part turbostratic boron nitride; and FIGS. 3B and 3C are powder X-ray diffraction patterns of boron nitride by vapor deposition and of conventional hexagonal boron nitride powder both of which have been commercially available.

BEST MODE OF CARRYING OUT THE INVENTION

Figure 1:
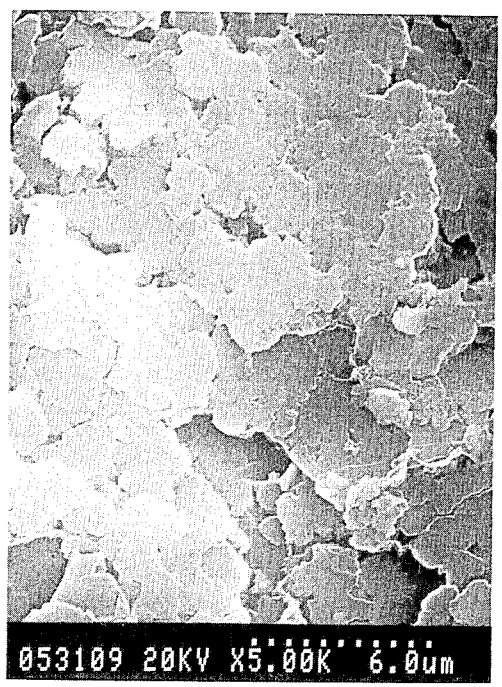
FIG. 1 is a scanning electron micrograph showing the microstructure of polycrystalline boron nitride of the present invention consisting essentially of rhombohedral crystals.

The present invention will now be described in detail with reference to the accompanying drawings.

The boron nitride of the present invention is polycrystalline boron nitride consisting essentially of rhombohedral crystals and, as shown in a scanning electron micrograph of FIG. 1, the crystal planes are oriented in parallel. FIG. 2A is a view illustrating a polycrystalline boron nitride consisting essentially of only rhombohedral crystals FIGS. 2 B and 2C are X-ray diffraction patterns of one face (face A) of polycrystalline rhombohedral boron nitride shown in FIG. 2A and another face (face B) nearly perpendicular to the face A. The X-ray diffraction pattern of the face A shown in FIG. 2B shows very strong diffraction lines (▲) of the plane perpendicular to the three-fold rotation axis of the rhombohedral crystal ( or perpendicular to the c-axis, when the notation of hexagonal crystal system is used to represent the crystal as a matter of convenience), in comparison with the diffraction lines (o) of the plane nearly parallel to the three-fold rotation axis. On the other hand, in the diffraction pattern of the face B shown in FIG. 2C, the diffraction lines, indicated by "o", of a plane parallel to the three-fold rotation axis are strong and the diffraction lines of the perpendicular plane are weak. As will be seen from these X-ray diffraction patterns, the boron nitride of the present invention is polycrystalline boron nitride comprising rhombohedral crystals having a three-fold rotation oriented preferentially to one direction.

The polycrystalline boron nitride comprising rhombohedral crystals produced by the method of the present invention has a bulk density in the range of 1.90 to 2.24 g/cm$^3$. The inventors' careful studies on polycrystalline boron nitride have revealed that boron nitride with a low bulk density level of 1.4 to 1.7 g/cm$^3$ is unstable and is liable to react with moisture in the air, while boron nitride with a high bulk density of not less than 1.9 g/cm$^3$ reacts very slowly with moisture and practically the reaction is negligible. The invention polycrystalline boron nitride comprising rhombohedral crystals has a high bulk density of 1.9 g/cm$^3$ or greater and does not create any problem or trouble associated with moisture-resistance properties.

Since the polycrystalline rhombohedral boron nitride of the present invention can be directly produced in a solid phase, such as film or massive form, by vapor deposition process it does not need the use of any sintering acceleration agent, unlike the usual sintering process for producing massive products. Therefore, according to the present invention, there can be obtained highly pure boron nitride free of contaminants and its purity reaches the level of 99.9% or higher.

As set forth above, the polycrystalline rhombohedral boron nitride of the present invention is a novel material having superior properties and quite different from any known rhombohedral boron nitride powder or wool-like materials.

The invention polycrystalline boron nitride comprising rhombohedral crystals, like heretofore known boron nitride by vapor deposition, can be produced by a vapor deposition process, but is entirely different from the conventional boron nitride by vapor deposition in that the conventional boron nitride comprises hexagonal crystals and turbostratic structure crystals, whereas the invention boron nitride consists essentially of rhombohedral crystals. Rhombohedral boron nitride can be easily distinguished from boron nitrides with hexagonal structure and turbostratic structure by means of usual structural analysis, such as X-ray diffraction or electron-diffraction method.

The polycrystalline rhombohedral boron nitride of the present invention is polycrystalline boron nitride consisting essentially of rhombohedral boron nitride crystals, but turbostratic boron nitride may be contained together with rhombohedral boron nitride. FIG. 3 A is a powder X-ray diffraction pattern of the polycrystalline boron nitride of the present invention comprising rhombohedral crystals and more specifically, this is a X-ray diffraction pattern of polycrystalline boron nitride is constituted of two kinds of boron nitrides with different structures, i.e., rhombohedral structure and turbostratic structure. For comparison purposes, powder X-ray diffraction patterns of conventional boron nitride by vapor deposition and hexagonal boron nitride powder, both commercially available, are shown in FIGS. 3B and 3C. These X-ray diffraction patterns were obtained using CuK$\alpha$ radiation. In FIGS. 3A to 3C, rhombohedral boron nitride, hexagonal boron nitride and turbostratic boron nitride are marked with "o", "▲" and "Δ" respectively. As shown in FIG. 3A, the polycrystalline boron nitride of the present invention comprises rhombohedral boron nitride crystals. On the other hand, it can be seen from FIG. 3B that the commercially available boron nitride prepared by conventional vapor deposition is composed of hexagonal boron nitride and turbostratic boron nitride, but no rhombohedral boron nitride crystal is contained. As set forth above, the polycrystalline boron nitride according to the present invention is entirely different from any known boron nitride by vapor deposition and thus they can be easily distinguished from each other.

The aforesaid polycrystalline boron nitride of the present invention consisting essentially of rhombohedral crystals is of high purity and high density and can be obtained as massive or film articles with various shapes, such as sheet, pipe and crucible, depending on the purposed use.

As previously described, the polycrystalline rhombohedral boron nitride can be readily transformed to cubic boron nitride due to the likeness of crystal structure. Thus, the massive or film products of the invention polycrystalline boron nitride comprising rhombohedral boron nitride crystals are especially suited for use as starting materials for the preparation of massive or thin film articles of cubic boron nitride. Further, although rhombohedral boron nitride is entirely different from hexagonal boron nitride and turbostratic boron nitride in crystal structure, it is composed of the same constituent elements as other structures of boron nitrides and the constituent elements forms the same hexagonal network layers mainly linked by van der Waals force. Therefore, rhombohedral boron nitride of the present invention is similar to boron nitrides with hexagonal and turbostratic structure in chemical and electrical properties, and will have good utility in the same applications as in known vapor-deposited boron nitride with hexagonal or turbostratic structure, such as crucibles for melting semiconducting materials, various jigs for high temperature services, high-frequency electric insulators, microwave transmission windows and diffusion source of boron for semiconductors.

The method of preparing rhombohedral boron nitride according to the present invention will now be described hereinafter.

The rhombohedral boron nitride of the present invention can be obtained by chemical vapor deposition comprising the steps of introducing a source gas of boron and a source gas of nitrogen with or without a carrier gas into a reactor having a heated substrate therein and depositing boron nitride onto the heated substrate in which a diffusion layer of the source gas of nitrogen and/or the diluting carrier gas is formed around the heated substrate, thereby depositing boron nitride onto the heated substrate.

As the source gas of boron above mentioned, there can be used at least one selected from the group consisting of halides, such as $BCl_3$, $BF_3$ and $BBr_3$; hydrides, such as $B_2H_6$ and $B_{10}H_{14}$; nitrogen-containing boron compounds, such as $B_3N_3H_3$ (borazine) and $B_3N_3H_3Cl_3$ (borazole trichloride) and alkyl boron compounds, such as $B(C_2H_5)_3$ and $B(CH_3)_3$. Among those source gases, $B_2H_6$, $BCl_3$ and $B_3N_3H_3$, which are gas at room temperature, are preferably used.

The source gas of nitrogen used in the present invention may be at least one selected from the group consisting of nitrogen hydrides, such as $HN_3$, $NH_3$ and $N_2H_2$; ammonium halides, such as $NH_4Cl$, $NH_4Br$, $NH_4F$, $NH_4HF_2$ or $NH_4I$ and nitrogen and, among them, $NH_3$ can be most preferably used because it is inexpensive.

Boron-free gases of Ar, He, $H_2$ and $N_2$ which do not affect detrimentally the resulting boron nitride may be used as suitable diluting carrier gas.

Although graphite, sintered hexagonal boron nitride and sintered composite of $TiB_2$—BN which have a high heat resistance, a high corrosion resistance and a good workability may be suitable as materials for the substrate, there is no specific limitation so long as the materials are resist to the given production temperature.

The shapes and dimensions of the substrate vary in accordance to those of the desired products. For example, for the preparation of sheet-like articles, a substrate having a flat face of desired dimensions is used and, for crucible-making, a substrate which has the shape corresponding to the interior of the desired crucible is used. Since, in vapor deposition process, rhombohedral boron nitride is, as referred to in the present invention, successively piled up on a substrate, the piled rhomboheral boron nitride itself serves as a substrate.

The temperature of the heated substrate means the surface temperature of a solid onto which is to be adsorbed atoms, molecules and high molecular intermediates produced or existing in vapor phase. Therefore, at an initial stage of vapor deposition, the substrate temperature means the surface temperature of the substrate such as graphite or other heat-resistant metal set forth above, but, once rhombohedral boron nitride is deposited onto the substrate, the deposited layer of rhombohedral boron nitride itself serves as substrate and the surface temperature of the deposited layer is taken as the temperature of the heated substrate of the present invention.

When the surface temperature of the heated substrate is 1700° C. or higher, rhombohedral boron nitride can not be obtained, because such high temperatures provide hexagonal boron nitride; a mixture of hexagonal boron nitride and turbostratic boron nitride; or turbostratic boron nitride. Thus, the temperature of the heated substrate must be maintained below 1700° C.

The rhombohedral boron nitride of the present invention may be produced at temperatures of 600° C. or higher by activating boron source gas with the aid of microwave energy, laser energy, etc.

Therefore, the temperature of the heated substrate must be at least 600° C. but below 1700° C., preferably 200 to lower than 1700 ° C. and more preferably 1450 to 650° C.

As the reactor, a vacuum tight enclosure may be used and a so-called cold wall type CVD system in which the wall of the reactor is cooled is preferably used.

Although the total gas pressure within the reactor may be atmospheric pressure during the production process, preferably a low pressure below 20 Torr and more desirably a pressure of 1 to 5 Torr may be employed.

In the present invention, the diffusion layer of nitrogen source gas and/or a diluting carrier gas should be formed around the heated substrate. As an embodiment for this, the end of a gas inlet tube for a nitrogen source gas and/or a diluting carrier gas is disposed near the substrate and those gases are blown against the substrate surface or flow on it in such a manner that the substrate is surrounded with the gas stream of the nitrogen source gas and/or the diluting carrier gas.

In the formation of the diffusion layer of a nitrogen source gas and/or a diluting carrier gas by using inlet tube for these gases as set forth above, the formed diffusion layer is variable in its thickness and properties depending on the shape, the manner of setting of the gas inlet tube, the flow rate of the source gas of nitrogen and/or the carrier gas and the total gas pressure within the reactor. As a result of the inventors' careful investigation on these conditions, it has been found that when the cross section area (S cm$^2$, of the end of a gas inlet tube for introducing a source gas of nitrogen and/or a diluting carrier gas, the flow rate (FR ml/min. at normal conditions) of the source gas of nitrogen and/or the carrier gas, the total gas pressure (P Torr) within a reaction vessel and the distance (L cm) between the end of the gas inlet tube and a substrate are adjusted so that, in the equation defined as $f = FR / (S \times P^2 \times L)$, f is two or greater, the foregoing diffusion layer of the source gas of nitrogen and/or the carrier gas is efficiently formed, thereby the rhombohedral boron nitride of the present invention can be deposited in a high yield.

The end of a inlet tube for a source gas of boron may be positioned in any place so long as the boron source gas is introduced into a reactor. However when the source gases of boron and nitrogen can readily react, as in the case of using boron halide gas and ammonia gas as the source gases, the boron nitride can be obtained in high yield by introducing the boron source gas in such a manner that it surrounds the gas stream forming the above diffusion layer by using a coaxial double tube or other appropriate multiple tubes.

In the present invention, the reason why rhombohedral boron nitride can be produced on a substrate by forming a diffusion layer of nitrogen source gas and/or a diluting carrier gas around a substrate is considered as follows.

The formation process of solid phase by vapor deposition is generally considered as follows: Source gases react in vapor phase to produce intermediates, the intermediates are adsorbed on the surface of a substrate, and then solid phase is formed by decomposition, rearrangement, nucleation and growth of the intermediates.

The present inventors have conducted further detailed studies on the formation of boron nitride by vapor deposition and found that the formation process of the foregoing solid phase is varied depending on its processing conditions and, more specifically, the formation process of boron nitride with a turbostratic structure is different from that of crystalline boron nitride, which has a three-dimensional arrangement and shows diffraction lines of (hkl) by X-ray diffraction. In the case of the former boron nitride, high molecular weight intermediates or aggregates having a size as large as soot are formed and adsorbed on a substrate, while, in the latter case, intermediate products of low molecular weight or molecules of source gases themselves are adsorbed onto a substrate and give the latter crystalline boron nitride after nucleation and growth. Therefore, it is considered that, in the production of crystalline boron nitride, gaseous species adsorbed onto the substrate surface should be intermediates of low molecular weight or molecules of source gases themselves.

During the vapor deposition process, gaseous layer referred to as diffusion layer exists around a substrate and various intermediates in gas phase are considered to reach the substrate surface through this diffusion layer.

In the present invention, this diffusion layer is formed by the source gas of nitrogen and/or the diluting carrier gas and intermediates are mainly formed as precursors of boron nitride around the outside of the diffusion layer. Since among the intermediates, intermediates of low molecular weight have a large diffusion coefficient as compared to large molecular weight intermediates, they are preferentially through the diffusion layer and are adsorbed onto a substrate surface to give crystalline boron nitride. In such deposition process, it is considered that when the temperature of the substrate is below 1700° C., polycrystalline boron nitride comprising rhombohedral boron nitride crystals are produced.

The polycrystalline boron nitride of the present invention comprising rhombohedral boron nitride crystals can be produced at lower temperatures than vapor-deposited boron nitride heretofore widely used and thus is highly valuable from the industrial view point.

Now, the present invention will be more specifically described with reference to the following Examples. In these Example, unless otherwise indicated, gas flow rate is represented at normal conditions (20° C. 1 atm.) the value of "f" is the same as previously defined.

EXAMPLE 1

BCl$_3$, NH$_3$ and hydrogen (H$_2$) were used as source gases of boron and nitrogen and a diluting carrier gas, respectively, and these gases were introduced into a reactor through a coaxial double tube composed of an inner tube with a inner diameter of 10 mm and an outer tube with a inner diameter of 18 mm. A mixed gas of BCl$_3$ gas (150 ml/min) and H$_2$ gas (600 ml/min) were introduced into the reactor through the outer tube while blowing a mixed gas of NH$_3$ (90 ml/min) and H$_2$ (60 ml/min) through the inner tube onto a graphite substrate disposed in the reactor. The reaction was carried out for 10 hours and, during this reaction, the graphite substrate disposed in the reactor was kept at 1600° C. and the total gas pressure within the reactor was maintained at 3 Torr by controlling the exhaust value, while continuously feeding the above gases. The value of "f" was adjusted to 10.6. Thereafter, gas remaining in the reactor was evacuated, and then the substrate was cooled and removed from the vessel. A white thin plate 0.5 mm thick was deposited on the substrate surface. This white thin plate was removed from the substrate and was identified by means of X-ray diffraction method and it was found that the resulting product consisted essentially of rhombohedral boron nitride crystals of at least 1000 Å in size whose threefold rotation axes were oriented in the direction perpendicular to the deposition surface. The bulk density of the polycrystalline boron nitride plate was 2.24 g/cm$^3$.

Alternatively, a 0.2 mm thick polycrystalline boron nitride comprising rhombohedral crystals was obtained under the same reaction conditions as described above except that the temperature of the substrate was kept at 1450° C. It has been found that rhombohedral crystals composing this polycrystalline boron nitride were approximately 800° Å in size and their three-fold rotation axes were preferentially oriented in the same direction. The bulk density was 2.08 g/cm³. For comparison purposes, further vapor-deposited boron nitrides were produced under the same processing conditions as described in Example 1 except that the temperature of the substrate was adjusted to 1800° C. and 1900° C. The boron nitrides thus produced were both composed of hexagonal boron nitride and turbostratic boron nitride.

EXAMPLE 2

$BCl_3$ and $NH_3$ were used as source gases of boron and nitrogen and $H_2$ and $N_2$ were used as carrier gases. Using the same coaxial double tube as in Example 1, a mixed gases of $NH_3$ (50 ml/min) and $N_2$ (100 ml/min) was blown through the inner tube onto a $TiB_2$-BN composite sintered substrate being maintained at 1500° C. in a reactor and a mixed gas of $BCl_3$ (70 ml/min) and $H_2$ (300 ml/min) was introduced through the outer tube into the reactor. Reaction was carried out for four hours while maintaining the total gas pressure in the reactor at 5 Torr (f=5.1), thereby the substrate was coated with 0.1 mm thick white product. The resulting white product was cut off for its structural analysis by X-ray diffraction and it was found that the white product was polycrystalline boron nitride consisting of rhombohedral boron nitride and turbostratic boron nitride crystals and these constituent crystals have a three-fold rotation axis with a preferred orientation. The size of the rhombohedral boron nitride crystal was calculated from its full width of half maximum intensity of X-ray diffraction line and found to be at least 1000 Å. Further, the crystallite size of boron nitride with turbostratic structure crystal was 80 Å. The polycrystalline boron nitride was further examined for cation purity by emission spectrochemical analysis but no impurity was detected. The bulk density was 1.98 g/cm³.

EXAMPLE 3

Graphite having a rectangular flat face of 70 mm×20 mm was used as a substrate and polycrystalline boron nitride was deposited onto the flat face in the following manner. $NH_3$ and $BCl_3$ were used as source gases of nitrogen and boron and $H_2$ was used as a diluting carrier gas. A mixed gas of $NH_3$ (90 ml/min) and $H_2$ (400 ml/min) was blown against the substrate from a gas blowing tube having a rectangular opening of 10 mm×50 mm. A mixed gas of $BCl_3$ (140ml/min) diluted with $H_2$ (300ml/min) was introduced through another gas inlet tube to the reactor. Vapor deposition was carried out for 7 hours and throughout this deposition the surface temperature of the substrate and the total gas pressure within the reactor were maintained at 1650° C. and 3 Torr (f=7.3). The resulting product was a white polycrystalline boron nitride sheet having a thickness of 0.4 mm and consisting essentially of only rhombohedral boron nitride crystals and its bulk density was 2.06 g/cm³.

Alternatively, boron nitride was produced under the same conditions as set forth above except for directing the opening, 10 mm in diameter, of the end of a gas blowing tube for the mixed gas of $NH_3$ and $H_2$ to the central portion of the flat face, 70 mm×20 mm, of the substrate. The product thus obtained was similar in appearance to the product obtained using the gas blowing tube having the rectangular opening of 10×50 mm, but it was found from the structural analysis by X-ray diffraction that the invention boron nitride was deposited only on the central portion with a diameter of about 20 mm, onto which the gases of $NH_3$ and $H_2$ were blown, in the rectangular face of 70 mm×20 mm of the substrate but, on the other portion, only boron nitride with turbostratic structure was vapor deposited.

EXAMPLE 4

Nitrogen-containing boron compound, i.e.,borazine ($B_3N_3H_6$), was used as a source gas of boron and nitrogen and was introduced at a flow rate of 10 ml/min into the reactor through the outer tube of the coaxial double tube used in Example 1. Vapor deposition was continued for 7 hours while $H_2$ gas (100 ml/min) was blown onto a graphite substrate (30 mm×13 mm×2 mm) heated at 1600° C. During this deposition process, the total gas pressure within the reactor was maintained at 1 Torr and "f" was 8.0. The substrate was taken out of the reactor and it was found that a somewhat yellowish white film with a thickness of 1 mm was deposited on the substrate. The X-ray analysis of this white film showed that the resulting white product was polycrystalline boron nitride with a preferred crystallite orientation consisting of rhombohedral boron nitride crystals with a slight amount of boron nitride of turbostratic structure. The bulk density of this polycrystalline boron nitride was 2.19 g/cm³.

EXAMPLE 5

$BCl_3$, $NH_3$ and $H_2$ were used as source gases of boron and nitrogen and a carrier gas and were introduced into a reactor using a coaxial double tube having an inner tube with a cross section of S cm². The distance between the end of inner tube and a substrate was L cm. A mixed gas of $NH_3$ gas (90 ml/min) and $H_2$ gas (A ml/min) was blown at a flow rate of FR ml/min onto a graphite substrate being heated at 1600° C. through the inner tube and another mixed gas of $BCl_3$ gas (140 ml/min) and $H_2$ gas, (670-A) ml/min, was supplied through the outer tube of the coaxial double tube. Reaction was carried out for two hours while maintaining the total gas pressure in the reaction vessel at P Torr to give a white deposit on the graphite substrate. Various deposits were obtained by varying the above processing parameters, S, L, FR and P, and structural analysis was conducted for each deposit by X-ray diffraction method. The processing conditions for each deposit were put in the equation, $f = FR / (S \times P^2 \times L)$ (wherein FR=90+A) to obtain "f" values, and the thus obtained values of "f" are given with the results of the structural analysis by X-ray diffraction in Table 1 below. In the table, oriented polycrystalline boron nitride consisting essentially of rhombohedral crystals is indicated with the symbol⊚and oriented polycrystalline boron nitride consisting of rhombohedral crystals and trubostratic structure boron nitride was indicated with circle "⊙". Boron nitride not containing rhombohedral crystal was indicated with "x".

It has been found from the results given in Table 1 that when S, L, FR and P are adjusted so that the value of "f" is at least 2, oriented polycrystalline boron nitride comprising rhombohedral crystals can be produced.

TABLE 1

| Processing Conditions | | | | | Structure of BN |
|---|---|---|---|---|---|
| P (Torr) | S (cm²) | FR(ml/min) | L (cm) | f | |
| 3 | 0.72 | 130 | 2.5 | 8.0 | ⊚ |
| 3 | 2.29 | 250 | 2.0 | 6.1 | ⊙ |
| 3 | 0.57 | 90 | 3.0 | 5.9 | ⊚ |

TABLE 1-continued

| Processing Conditions | | | | | Structure of BN |
|---|---|---|---|---|---|
| P (Torr) | S (cm$^2$) | FR(ml/min) | L (cm) | f | |
| 3 | 0.72 | 90 | 2.5 | 5.5 | o |
| 3 | 0.57 | 90 | 4.0 | 4.4 | o |
| 5 | 0.33 | 90 | 2.5 | 4.4 | o |
| 3 | 1.06 | 90 | 2.5 | 3.8 | o |
| 10 | 0.33 | 150 | 2.0 | 2.3 | o |
| 3 | 2.29 | 90 | 2.5 | 1.7 | x |
| 10 | 0.33 | 90 | 2.5 | 1.1 | x |

INDUSTRIAL APPLICABILITY

As set forth above, the polycrystalline boron nitride of the present invention comprising rhombohedral crystals with a preferred orientation has a high purity and a high density and is very useful in applications such as crucibles for melting semiconductors, various jigs for high temperature services, high-frequency insulator, microwave transmission windows and as a boron source material for semiconductors. Further, besides the above advantages, the boron nitride of the present invention is also most suitable as a starting material for the preparation of high pressure phase cubic boron nitride which is highly valuable for industrial application.

According to the production method of the present invention, such boron nitride, unlike the conventional preparation of rhombohedral boron nitride powder, can be obtained without using any very toxic reactant, such as cyanide compound, thereby without any danger. Further, the invention boron nitride can be readily produced in any desirable form.

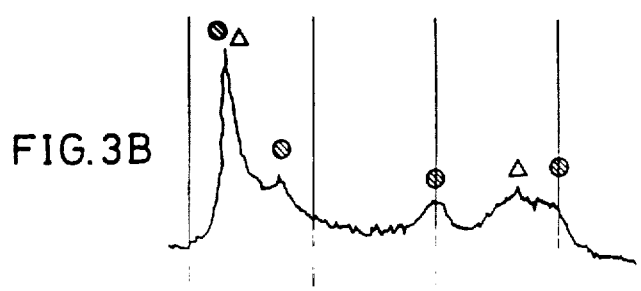

We claim:

1. A polycrystalline rhombohedral boron nitride of a bulk density ranging from 1.90 to 2.24 g/cm$^3$ and obtained as a self supporting massive material or as a thin film, consisting essentially of rhombohedral crystals in which the 3-fold rotation axes (parallel to the c-axis in the notation of the hexagonal crystal system) of said crystals have a preferred orientation.

2. The polycrystalline rhombohedral boron nitride as claimed in claim 1, wherein said boron nitride includes, in part, boron nitride which has a turbostratic or amorphous structure.

3. The polycrystalline rhombohedral boron nitride of claim 1, wherein the rhombohedral boron nitride has the X-ray diffraction patterns of FIGS. 2B and 2C when taken perpendicular to the 3-fold rotation axes of the rhombohedral crystal and when taken parallel to the 3-fold rotation axes of the rhombohedral crystal.

4. A polycrystalline rhombohedral boron nitride having a bulk density ranging from 1.90 to 2.24 g/cm$^3$ prepared by a process consisting essentially of:

passing a source gas of boron and a source gas of nitrogen each through a gas inlet tube, with or without the presence of a diluting carrier gas, into a reactor containing a heated substrate in a fashion such that a diffusion layer of said source gas of nitrogen and/or said carrier gas is formed over the substrate heated to a temperature lower than 1700° C. under conditions specified by the relationship: $FR/(S \times P^2 \times L) \geq 2$, wherein S is the cross-sectional area (cm$^2$) of the end of said gas inlet tube for introducing said nitrogen source gas or said carrier gas, FR is the flow rate (ml/min) under the normal conditions of 20° C., 1 atm of said nitrogen source gas and/or said carrier gas, P is the total gas pressure (Torr) within said reactor, and L is the distance (cm) between the end of said gas inlet tube and the deposition surface of said substrate, said source gas of boron being a boron halide, a boron hydride, a nitrogen-containing boron compound or an alkyl boron compound and said source gas of nitrogen being a nitrogen hydride, an ammonium halide or molecular nitrogen; and depositing polycrystalline boron nitride as rhombohedral crystals onto said heated substrate such that the 3-fold rotation axes (parallel to the c axis in the notation of the hexagonal crystal system) of said crystals have a preferred orientation.

5. In a method of producing boron nitride by chemical vapor deposition which includes the steps of introducing a source gas of boron and source gas of nitrogen through a gas inlet tube, with or without a diluting carrier gas, into a reactor containing a heated substrate and depositing boron nitride onto said substrate, the improvement which comprises:

forming a diffusion layer consisting essentially of said source gas of nitrogen plus any carrier gas for the gases introduced into the reactor around the substrate heated to a temperature lower than 1700° C. under conditions specified by the relationship: $FR/S \times P^2 \times L) \geq 2$, wherein S is the cross-sectional area (cm$^2$) of the end of said gas inlet tube for introducing said nitrogen source gas or said carrier gas, FR is the flow rate (ml/min) under the normal conditions of 20° C., 1 atm of said nitrogen source gas and/or said carrier gas, P is the total gas pressure (Torr) within said reactor, and L is the distance (cm) between the end of said gas inlet tube and the deposition surface of said substrate and introducing a source gas of boron separate from said nitrogen source gas, thereby depositing polycrystalline boron nitride of a bulk density ranging from 1.90 to 2.24 g/cm$^3$ consisting essentially of rhombohedral crystals onto said heated substrate in which the 3-fold rotation axes (parallel to the c axis in the notation of the hexagonal crystal system) of said crystals have a preferred orientation.

6. The method as claimed in claim 5, in which the temperature of said heated substrate is in the range of 1200° to less than 1700° C.

7. The method as claimed in claim 6, in which the temperature of said heated substrate is in the range of 1450° to 1650° C.

8. The method as claimed in claim 5, in which the total gas pressure in said reactor is below 20 Torr.

9. The method as claimed in claim 8, in which the total gas pressure in said reactor is within the range of 1 to 5 Torr.

10. The method as claimed in claim 5, 6, 7, 8 or 9, wherein said source gas of boron and said source gas of nitrogen are boron trichloride and ammonia respectively.

* * * * *

UNITED STATES PATENT AND TRADEMARK OFFICE
CERTIFICATE OF CORRECTION

PATENT NO. : 4,900,526  
DATED : Feb. 13, 1990  
INVENTOR(S) : Toshitsuga Matsuda, et al It is certified that error appears in the above-indentified patent and that said Letters Patent is hereby corrected as shown below:

The drawing sheet, consisting of Fig. 3B, should be deleted to be replaced with the drawing sheet, consisting of Fig. 3B, as shown on the attached page.

Signed and Sealed this

Third Day of August, 1993

Attest:

MICHAEL K. KIRK

Attesting Officer     Acting Commissioner of Patents and Trademarks